(12) United States Patent
Chung et al.

(10) Patent No.: US 8,735,276 B2
(45) Date of Patent: May 27, 2014

(54) SEMICONDUCTOR PACKAGES AND METHODS OF MANUFACTURING THE SAME

(75) Inventors: Hyun-Soo Chung, Hwaseong-si (KR);
Jae-Shin Cho, Yongin-si (KR);
Dong-Ho Lee, Seongnam-si (KR);
Dong-Hyeon Jang, Suwon-si (KR);
Seong-Deok Hwang, Seoul (KR);
Seung-Duk Baek, Hwaseong-si (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 205 days.

(21) Appl. No.: 13/365,378

(22) Filed: Feb. 3, 2012

(65) Prior Publication Data

US 2012/0129334 A1    May 24, 2012

Related U.S. Application Data

(62) Division of application No. 12/353,501, filed on Jan. 14, 2009, now abandoned.

(30) Foreign Application Priority Data

Jan. 22, 2008 (KR) .................. 10-2008-0006703

(51) Int. Cl.
*H01L 21/768* (2006.01)

(52) U.S. Cl.
USPC ........... 438/613; 438/653; 438/612; 438/654; 438/688; 438/106; 257/691; 257/E21.589; 257/E21.584; 257/738; 257/751

(58) Field of Classification Search
USPC .................. 438/613, 653, 612, 654.688, 106; 257/691, E21.589, E21.584, 738, 751, 257/734

See application file for complete search history.

(56) References Cited

U.S. PATENT DOCUMENTS

| | | | |
|---|---|---|---|
| 6,511,901 B1 * | 1/2003 | Lam et al. | 438/612 |
| 6,762,117 B2 | 7/2004 | Lam et al. | |
| 7,081,404 B2 | 7/2006 | Jan et al. | |
| 8,487,438 B2 * | 7/2013 | Lin et al. | 257/751 |
| 2008/0251924 A1 * | 10/2008 | Lin et al. | 257/758 |

FOREIGN PATENT DOCUMENTS

| | | |
|---|---|---|
| KR | 1020020044590 | 6/2002 |
| KR | 1020060058954 | 6/2006 |
| KR | 10-0643065 | 11/2006 |

* cited by examiner

*Primary Examiner* — Cathy N Lam
(74) *Attorney, Agent, or Firm* — Stanzione & Kim, LLP

(57) ABSTRACT

Provided are semiconductor packages and methods of manufacturing the semiconductor package. The semiconductor packages may include a substrate including a chip pad, a redistributed line which is electrically connected to the chip pad and includes an opening. The semiconductor packages may also include an external terminal connection portion, and an external terminal connection pad which is disposed at an opening and electrically connected to the redistributed line. The present general inventive concept can solve the problem where an ingredient of gold included in a redistributed line may be prevented from being diffused into an adjacent bump pad to form a void or an undesired intermetallic compound. In a chip on chip structure, a plurality of bumps of a lower chip are connected to an upper chip to improve reliability, diversity and functionality of the chip on chip structure.

20 Claims, 15 Drawing Sheets

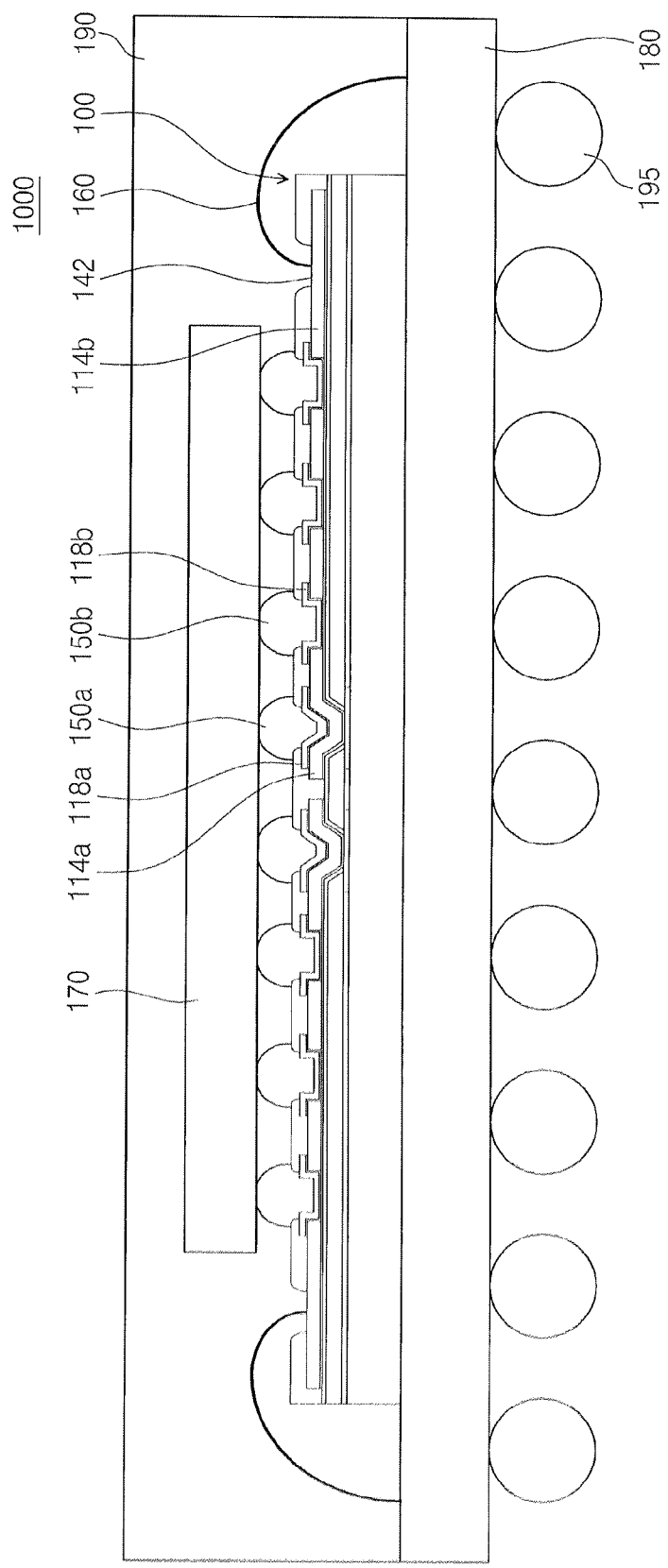

SEMICONDUCTOR PACKAGES AND METHODS OF MANUFACTURING THE SAME

CROSS-REFERENCE TO RELATED APPLICATIONS

This application is a Divisional Application of prior U.S. non-provisional patent application Ser. No. 12/353,501 filed on Jan. 14, 2009 now abandoned in the United States Patent and Trademark Office, which claims priority under 35 U.S.C. §119 of Korean Patent Application No. 2008-0006703, filed on Jan. 22, 2008, the entire contents of which are hereby incorporated by reference.

BACKGROUND OF THE INVENTION

1. Field of the Invention

Exemplary embodiments disclosed herein relate to semiconductor packages and methods of manufacturing the same, and more particularly, to semiconductor packages including two kinds of pads to which different kinds of external terminals are connected, and methods of manufacturing the same.

2. Description of the Related Art

A trend in the recent electronics industry is to manufacture a semiconductor device economically which is small, light, speedy, highly reliable, and highly efficient. One of the techniques which can manufacture the recently innovated semiconductor devices are semiconductor packaging techniques.

A recent application device of an integrated circuit requires a number of I/O pins, but a number of I/O pins causes many problems with relation to a conventional wire bonding package. A wire bonding package needs a number of pads to be formed around a semiconductor substrate. As the number of I/O pins increases, there is a limitation of a minimum bond pitch that occurs by a limited size of a substrate. Solder bump arrays have been developed to increase a capacity of I/O pins.

As a need to increase the number of I/O pins continuously increases, the technology needs to combine a solder bump array technique with a wire bonding technique so as to provide a high capacity of I/O pins. However, some characteristics of materials used in each of the techniques are unfavorable to work with. Materials suitable for use as solder bumps have poor characteristics of mechanical adhesion. Thus, a material like copper, for example, is a good soldering material but is not well selected for the use of a wire bonding. One reason is that copper easily forms an oxide layer that provides a bad bonding characteristic. Aluminum is also suitable for wire bonding. However, with aluminum, an oxide layer is formed on the entire surface thereof and the oxide must certainly be removed to get a strong soldering combination. However, corrosive agents for removing the oxide layer are very strong, so that aluminum disposed under an oxide layer is also corroded.

Gold is essentially needed for wire bonding. However, gold disposed on a solder bump pad is easily diffused into adjacent copper or adjacent solder and forms not only a void but also forms an undesired intermetallic compound that is vulnerable to an impact. Therefore, a structure of a redistribution pattern applicable to both a formation of a solder bump and wire bonding, and its manufacture may be required to alleviate the problems described above.

SUMMARY OF THE INVENTION

Some exemplary embodiments provide a semiconductor package. The semiconductor package may include a substrate including a chip pad, a redistributed line which is electrically connected to the chip pad and includes an opening and an external terminal connection portion, and a first external terminal connection pad which is disposed at the opening and electrically connected to the redistributed line.

Additional aspects and utilities of the present general inventive concept will be set forth in part in the description which follows and, in part, will be obvious from the description, or may be learned by practice of the general inventive concept.

Embodiments of the present general inventive concept may also by achieved by providing a semiconductor package, including a substrate including a chip pad, a redistributed line which is electrically connected to the chip pad and includes an opening and an external terminal connection portion, and a first external terminal connection pad which is disposed at the opening and electrically connected to the redistributed line.

The redistributed line is divided into a first redistributed line and a second redistributed line by the opening and the second redistributed line is connected to the first redistributed line.

The redistributed line is divided into a first redistributed line and a second redistributed line by the opening and the second redistributed line is spaced apart from the first redistributed line. The first external terminal connection pad is disposed between the first redistributed line and the second redistributed line. A first barrier layer is disposed between the first external terminal connection pad and the redistributed line to prevent an ingredient included in the redistributed line from being diffused into the first external connection pad.

A second external terminal connection pad is disposed on the redistributed line and electrically connected to the redistributed line. A second barrier layer which is disposed between the second external terminal connection pad and the redistributed line to prevent an ingredient included in the redistributed line from being diffused into the second external connection pad.

A lowest bottom surface of the first external terminal connection pad is at the same level with a lowest bottom surface of the second external terminal connection pad.

One of a solder bump is electrically connected to the first external terminal connection pad or a bonding wire is electrically connected to the external terminal connection portion.

A passivation layer is disposed on the substrate and exposes a portion of the chip pad so that the redistributed line provides a path connected to the chip pad, and an insulating layer is disposed on the passivation layer and exposes a portion of the redistributed line so that a portion of the redistributed line is used as the external terminal connection portion.

Exemplary embodiments of the present general inventive concept provide a semiconductor package that may include a first semiconductor package that includes a redistributed line including an external terminal connection portion that is disposed on a first chip, a bump pad electrically connected to the redistributed line, a solder bump connected to the bump pad, a bonding wire connected to the external terminal connection portion, a second semiconductor package including a second chip electrically connected to the first semiconductor package in a flip chip type by the medium of the solder bump, and a printed circuit board electrically connected to the first semiconductor package by the medium of the bonding wire. One of the first and second chips is a memory chip and the other is a logic chip.

The first semiconductor package may further include a barrier layer which is disposed between the bump pad and the redistributed line to prevent an ingredient included in the redistributed line from being diffused into the bump pad.

Some exemplary embodiments provide a method of manufacturing a semiconductor package including providing a substrate including a passivation layer exposing a chip pad, forming a first metal layer on the passivation layer, the first metal layer being electrically connected to the chip pad, forming a redistributed line including an opening on the first metal layer, the opening electrically connected to the chip pad and exposing a portion of the first metal layer, forming an external terminal connection pad on the redistributed line, the external terminal connection pad to which a first external terminal being connected, and forming an insulating layer exposing a portion of the redistributed line so as to use the portion of the redistributed line as an external terminal connection portion to which a different kind of a second external terminal is connected.

The opening divides the redistributed line into first and second redistributed lines of a connected configuration or a separated configuration. Forming the redistributed line includes forming a first photoresist pattern on the first metal layer, the first photoresist pattern exposing a portion of the first metal layer, forming first and second redistributed lines by plating a conductive layer including gold using the exposed first metal layer as a seed metal and using the first photoresist pattern as a mask, and forming the opening exposing the first metal layer by removing the first photoresist pattern.

The external terminal connection pad includes forming a second metal layer on the redistributed line, forming a first external terminal connection pad and a second external terminal connection pad on the second metal layer, and lowest bottom surfaces of the first and second external terminal connection pads being even with each other, wherein the first external terminal connection pad is formed on the first redistributed line and the second external terminal connection pad is formed on the opening, and forming a first barrier layer disposed between the first external terminal connection pad and the first redistributed line, and a second barrier layer disposed between second external terminal connection pad and the first and second redistributed lines by selectively removing the second metal layer.

Forming the external terminal connection pad includes forming a second photoresist pattern on the redistributed line, the second photoresist pattern exposing the opening, and forming the external terminal connection pad by plating a conductive layer using the first metal layer exposed by the opening as a seed metal and using the second photoresist pattern as a mask. A second metal layer is formed in the opening before forming the external connection pad, and the external terminal connection pad is formed by plating a conductive layer using the second metal layer as a seed metal and using the second photoresist pattern as a mask.

Forming the external terminal connection pad includes forming the insulating layer so that a space is formed between sides of the conductive layer and the insulating layer, and forming the external terminal connection pad so that the space is filled by reflowing the conductive layer.

Exemplary embodiments of the present general inventive concept may also be achieved by providing a semiconductor package including a first semiconductor package that includes a plurality of redistributed lines including recessed portions and non-recessed portions, bump pads disposed above the recessed portions and non-recessed portions, and solder bumps connected only to the bump pads disposed over the non-recessed portions of the redistributed lines.

Exemplary embodiments of the present general inventive concept may also be achieved by providing a semiconductor package including a substrate including a chip pad, a redistributed line electrically connected to the chip pad and includes an opening that divides a first redistributed line from a second redistributed line, a passivation layer disposed on the substrate, wherein thicknesses of the first and second redistributed lines are equal to a thickness of the passivation layer.

Exemplary embodiments of the present general inventive concept may also be achieved by providing a method of manufacturing a semiconductor package, forming a first metal layer on a passivation layer that exposes a chip pad, the first metal layer being electrically connected to the chip pad, and forming a redistributed line including an opening on the first metal layer, the opening dividing a first redistributed line from a second redistributed line such that thicknesses of a first distributed line and a second distributed line are equal to a thickness of the passivation layer.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIGS. 4A and 4B are cross-sectional views illustrating a semiconductor package of a multi-chip structure according to some embodiments of the present general inventive concept.

DETAILED DESCRIPTION OF THE PREFERRED EMBODIMENTS

Figure 1A:
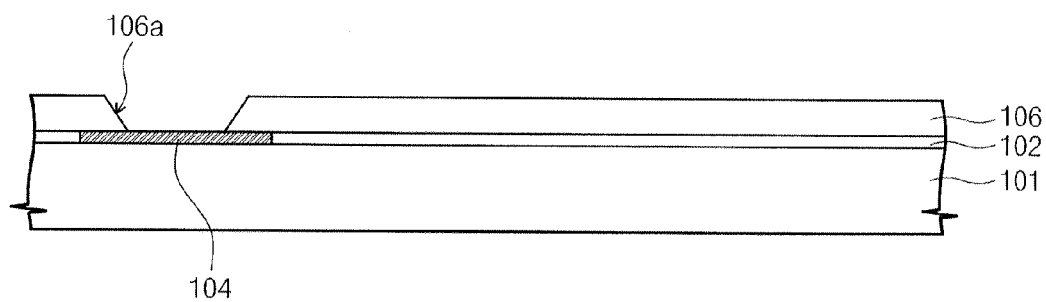
FIGS. 1A through 1K are cross-sectional views illustrating a method of manufacturing a semiconductor package according to an embodiment of the present general inventive concept.

The present general inventive concept now will be described more fully hereinafter with reference to the accompanying drawings, in which embodiments of the present general inventive concept are illustrated. The present general inventive concept may, however, be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the size and relative sizes of layers and regions may be exaggerated for clarity. Like numbers refer to like elements throughout.

FIGS. 1A through 1K are cross-sectional views illustrating a method of manufacturing a semiconductor package according to an embodiment of the present general inventive concept.

Referring to FIG. 1A, a substrate 101 including an integrated circuit (not illustrated) is provided. The substrate 101 may be a silicon wafer. A chip pad 104 (e.g., aluminum) which is electrically connected to the integrated circuit and a passivation layer 106 including an opening 106a which exposes the chip pad 104 may be formed on the substrate 101. An insulating layer 102 may be further formed between the substrate 101 and the passivation layer 106.

Figure 1B:
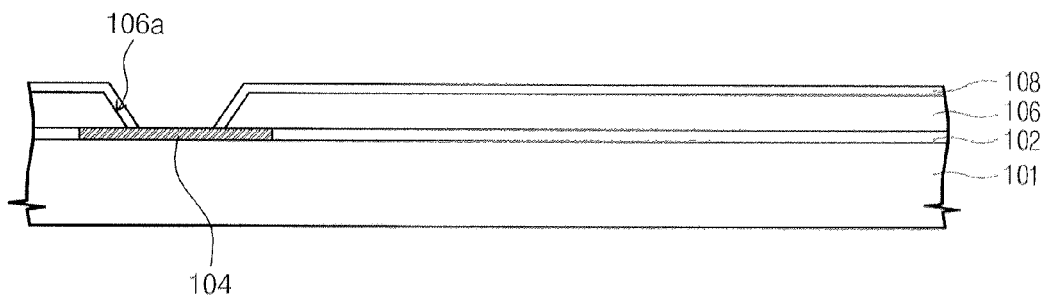

Referring to FIG. 1B, an insulating layer 108 may be selectively further formed on the passivation layer 106. The insulating layer 108 may be formed to cover only a portion of the opening 106a so as to expose the chip pad 104. If the integrated circuit can be isolated from other things (e.g., a redistributed line layer formed subsequently) by only the passivation layer 106, the insulating layer 108 may not be formed.

Figure 1C:
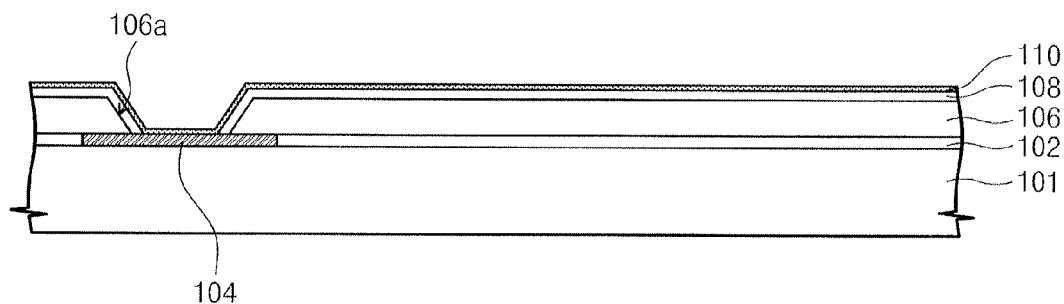

Referring to FIG. 1C, a first metal layer 110 which is electrically connected to the chip pad 104 is formed on the passivation layer 106. In the case that the insulating layer 108 is selectively further formed, the first metal layer 110 is formed on the insulating layer 108. As one example, the first metal layer 110 may be formed by sputtering copper (Cu), titanium (Ti)/copper (Cu), chromium (Cr)/copper (Cu), nickel (Ni), titanium (Ti), nickel (Ni), chromium (Cr)/nickel (Ni) or the like.

Figure 1D:
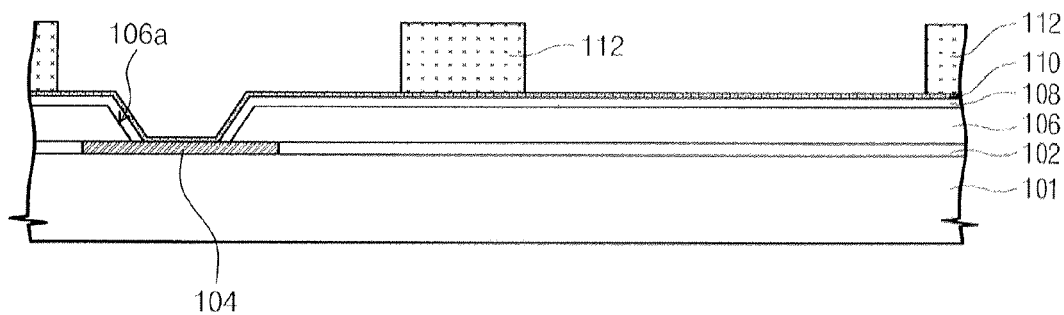

Referring to FIG. 1D, a photoresist pattern 112 is formed on the first metal layer 110. The photoresist pattern 112 may be used as a mask to form redistributed lines 114a and 114b which will be described in FIG. 1E.

Figure 1E:
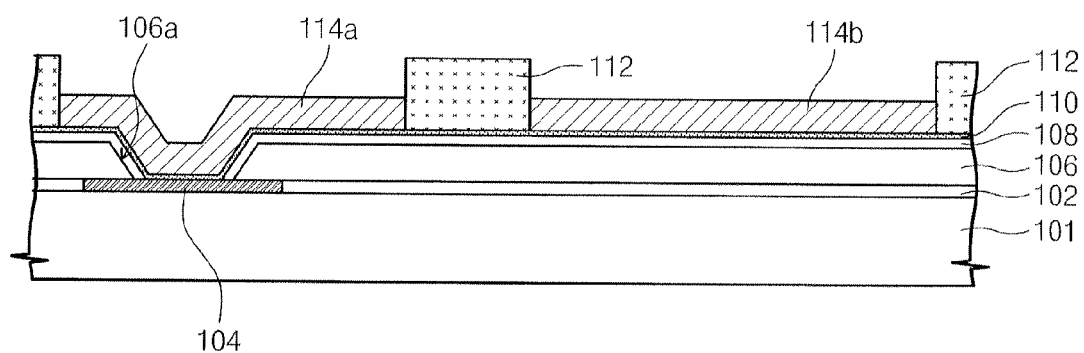

Referring to FIG. 1E, redistributed lines 114a and 114b are formed on the first metal layer 110. The redistributed lines 114a and 114b may be formed to be a structure that first and second redistributed lines 114a and 114b are connected as illustrated in FIG. 6B or a structure that first and second redistributed lines 114a and 114b are spaced apart from each other as illustrated in FIG. 6C. In the present embodiment, for example, the redistributed lines may be described to be divided into the first redistributed line 114a and the second redistributed line 114b. However, this does not mean that the first redistributed line 114a and the second redistributed line 114b are always spaced apart from each other.

A portion of the first redistributed line 114a may be recessed by the opening 106a. The redistributed lines 114a and 114b may be electrically connected to the chip pad 104 by the medium of the first metal layer 110. For example, the redistributed lines 114a and 114b may be formed of gold (Au) or copper (Cu)/Nickel (Ni)/gold (AU), or other combination to contact a gold or other material wire as illustrated in FIG. 1J. The redistributed lines 114a and 114b may be formed using electroplating or other known processes. In the case of forming the redistributed lines 114a and 114b using an electroplating process, the first metal layer 110 may be used as a seed metal layer.

Figure 1F:
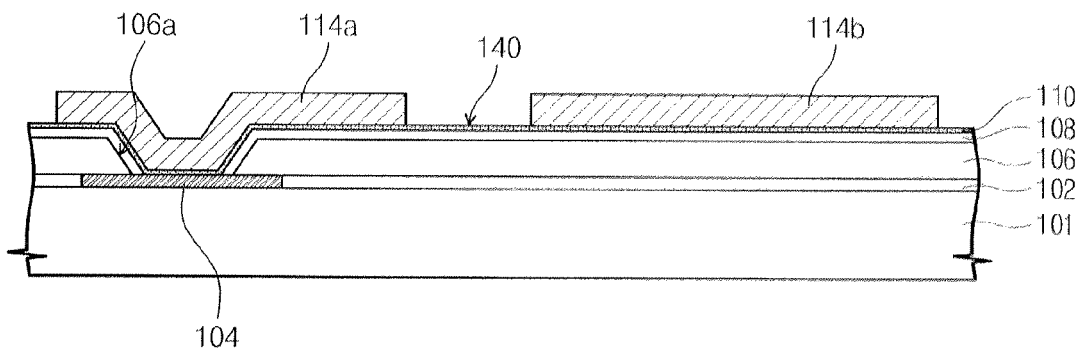

Referring to FIG. 1F, the photoresist pattern 112 is removed. An opening 140 exposing a portion of the first metal layer 110 is formed between the first redistributed line 114a and the second redistributed line 114b. A redistributed second bump pad (118b of FIG. 1H) is formed in the opening 140.

Figure 1G:
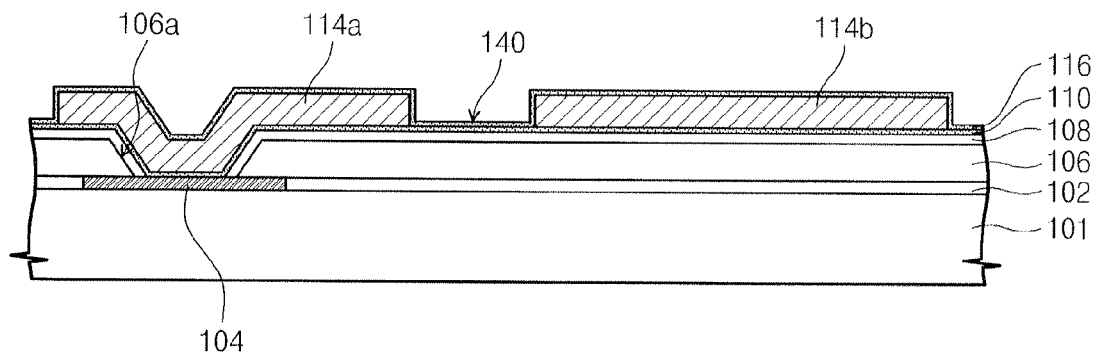

Referring to FIG. 1G, a second metal layer 116 is formed covering the redistributed lines 114a and 114b and the first metal layer 110. The second metal layer 116 surrounds a top surface and a side surface of each of the first and second redistributed lines 114a and 114b, and covers the first metal layer 110 exposed by the removal of the first photoresist pattern 112. For example, the second metal layer 116 may be formed by sputtering copper (Cu), titanium (Ti)/copper (Cu), chromium (Cr)/copper (Cu), nickel (Ni), titanium (Ti)/nickel (Ni), chromium (Cr)/Nickel (Ni) or the like.

Figure 1H:
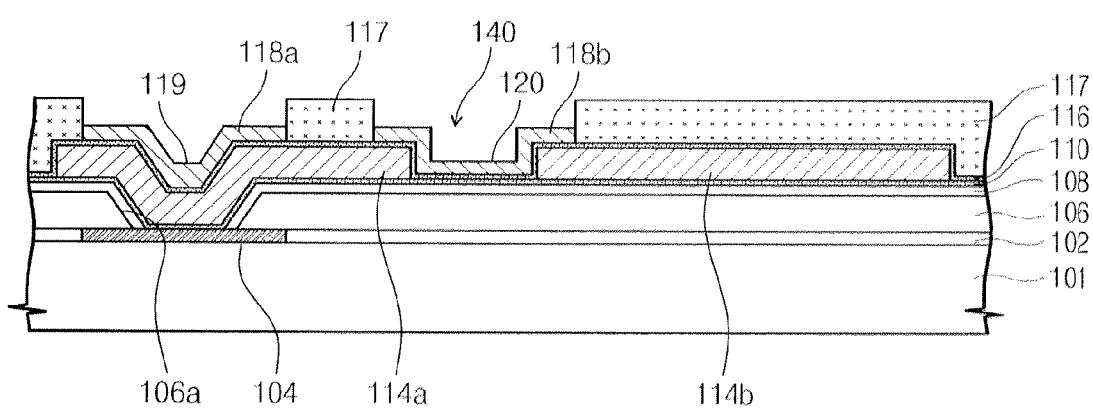

Referring to FIG. 1H, a photoresist pattern 117 is formed on the second metal layer 116. A first external terminal connection pad (i.e., a first bump pad 118a) is formed on the redistributed line 114a and a second external terminal connection pad (i.e., a second bump pad 118b) is formed between the first redistributed line 114a and the second redistributed line 114b by an electroplating using the photoresist pattern 117 as a mask. The first and second bump pads 118a and 118b may be external terminal connection pads to which external terminals, such as solder bumps, may be connected. The first and second bump pads 118a and 118b may be concurrently formed using solder or nickel, for example. In the case that the first and second bump pads 118a and 118b are formed by an electroplating process, the second metal layer 116 may be used as a seed metal layer.

Since the first bump pad 118a is formed on a first recessed portion of the first redistributed line 114a, a portion of the first bump pad 118a may also be recessed. Similarly, since the second bump pad 118b is formed on the opening 140, a portion of the second bump pad 118b may be recessed. A recessed portion of the first bump pad 118a constitutes the lowest surface 119 of the first bump pad 118a and a recessed portion of the second bump pad 118b constitutes the lowest surface 120 of the second bump pad 118b. It is preferable that a height of the lowest surface 119 is equal to or similar to a height of the lowest surface 120. The reason for this is that solder bumps (150a, 150b in FIG. 1K) which will be described later may have a same height relative to each other, so that an electrical connection can be uniformly distributed throughout the device. For example, a height of the lowest surface 119 of the first bump pad 118a can be equal to or similar to a height of the lowest surface 120 of the second bump pad 118b by controlling the process of forming the respective surfaces such that a thickness of the redistributed lines 114a and 114b may be equal to a thickness of the passivation layer 106.

Figure 1I:
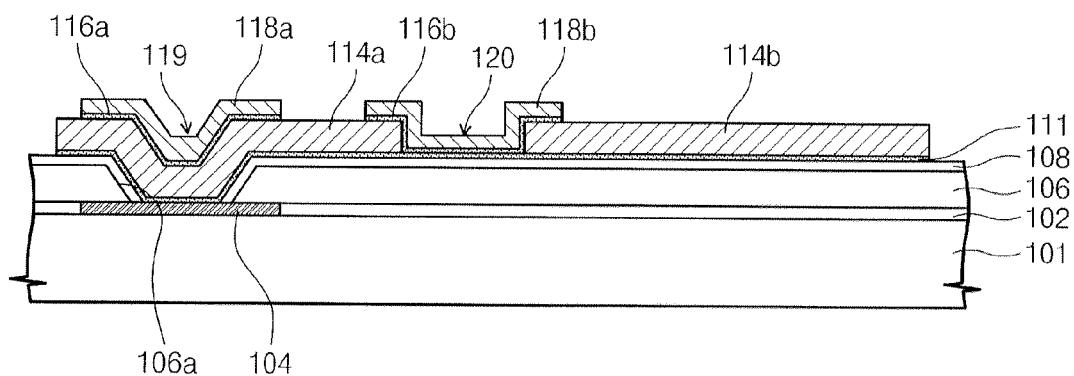
Figure 1J:
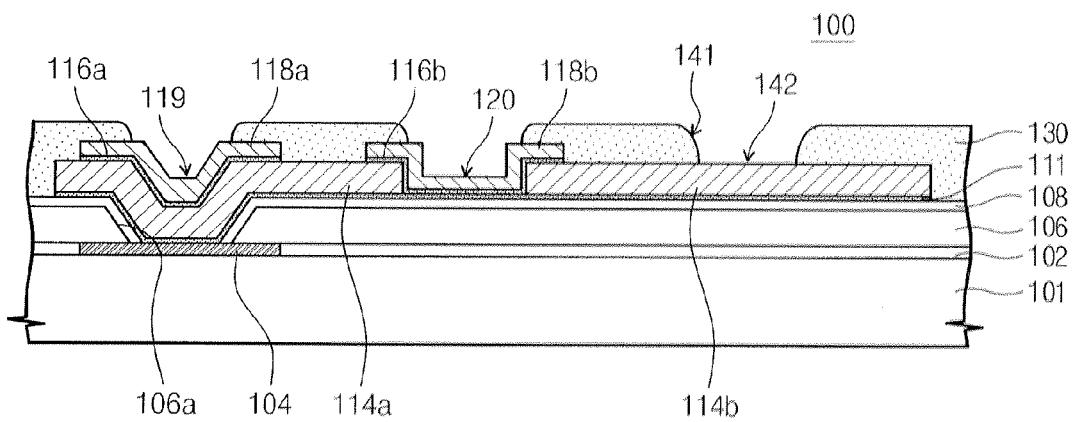

Referring to FIG. 1I, the photoresist pattern 117 is removed. A portion of the second metal layer 116 illustrated in FIG. 1H, exposed by a removal of the photoresist pattern 117, is also removed. The portion of the second metal layer 116 can be removed using the first and second bump pads 118a and 118b as an etching mask. When a portion of the second metal layer 116 is removed, a portion of the first metal layer 110 illustrated in FIG. 1H, exposed outside of or external to the first and second redistributed lines 114a and 114b, may be also removed with the second metal layer 116. The first metal layer 110 becomes a metal layer pattern 111 which is disposed under the first and second redistributed lines 114a and 114b by the removal of the portion of the first metal layer 110.

As further illustrated in FIG. 1I, by the removal of the outside or external portion of the second metal layer 116, the remaining portions of the second metal layer 116 become a metal layer pattern 116a that is disposed between the first bump pad 118a and the first redistributed line 114a, and a metal layer pattern 116b that is disposed between the second bump pad 118b and the second redistributed line 114b.

The metal layer pattern 116a may function as a barrier layer preventing an ingredient (e.g., gold) included in the first redistributed line 114a from being diffused into the first bump pad 118a when the layers undergo an annealing or other type of heating or other process that could cause diffusion of gold or any other metal. The metal layer pattern 111 may also act as a barrier layer preventing an ingredient in the first redistributed line 114a or the second redistributed line from diffusing into the lower layers of the semiconductor device. If the metal layer pattern 116a is not present, an ingredient (e.g., gold) included in the first redistributed line 114a diffuses into the first bump pad 118a to form a void in first bump pad 118a and/or forms an undesired intermetallic compound in an interface between the first bump pad 118a and the first redistributed line 114a. The first bump pad 118a may be vulnerable to a negative impact due to a formation of an intermetallic compound. However, since the metal layer pattern 116a functions as a diffusion barrier, the phenomenon described above does not occur. Similarly, the metal layer pattern 116b may function as a barrier layer preventing an ingredient (e.g., gold) included in the first and second redistributed lines 114a and 114b from being diffused into the second bump pad 118b.

Referring to FIG. 1J, an insulating layer 130 including openings which expose portions of the first and second bump pads 118a and 118b, and the second redistributed line 114b is formed. The insulating layer 130 may be formed by a process of depositing an insulating material, a reflow process and a curing process, or other known processes. The insulating layer 130 is formed with a hole 141 that may expose a region on the second redistributed line 114b that may function as an external terminal connection portion 142 (e.g., a bonding pad to which a gold wire is connected). Thus, a semiconductor package 100 including first and second bump pads 118a and 118b, and the bonding pad 142 where a bonding wire (illustrated in FIG. 1K) such as a gold is connected, may be provided.

Figure 1K:
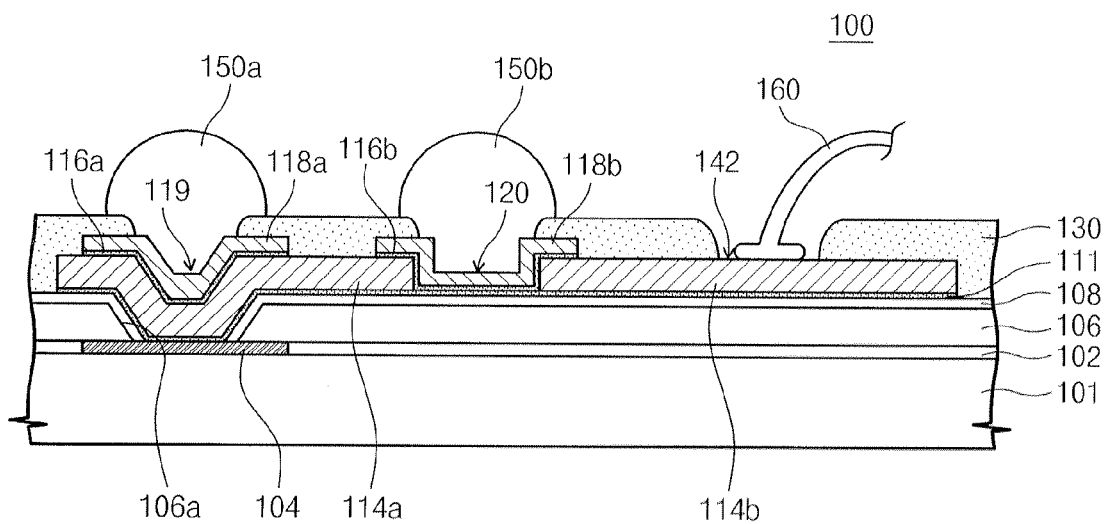

Referring to FIG. 1K, a first solder bump 150a connected to the first bump pad 118a and a second solder bump 150b connected to the second bump pad 118b may be selectively formed. As described above, since the lowest surface 119 of the first bump pad 118a and the lowest surface 120 of the second bump pad 118b have a same or a similar height relative to each other, the first and second solder bumps 150a and 150b, if formed to be substantially a same size, may have a same height or a similar height relative to each other as well. Thus, in the case when a semiconductor package 100 is electrically connected to a separate semiconductor chip or a separate semiconductor package, the electrical connections between adjacent chips or packages can be uniform. That is, when the semiconductor package 100 is attached to another semiconductor chip or package, a level and uniform physical package is created that can be more easily mounted on printed circuit boards (PCBs) and other external devices. This uniform and level arrangement allows the package as a whole to be made thinner as well as allows other semiconductor chips or packages to be formed on top of the semiconductor package 100 more compactly, therefore enhancing the versatility and functionality of the semiconductor package 100 and overall package structure. The second redistributed line 114b may be used as a bonding pad 142 where a bonding wire 160 is bonded thereto. Thus, the bonding wire 160 may be connected to the semiconductor package 100 along with the first and second solder bumps 150a and 150b.

Figure 6A:
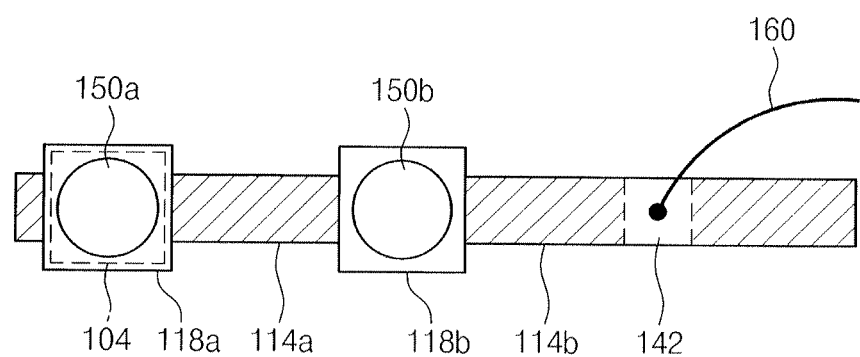
FIG. 6A is a top plan view illustrating a portion of FIG. 1K.
Figure 6B:
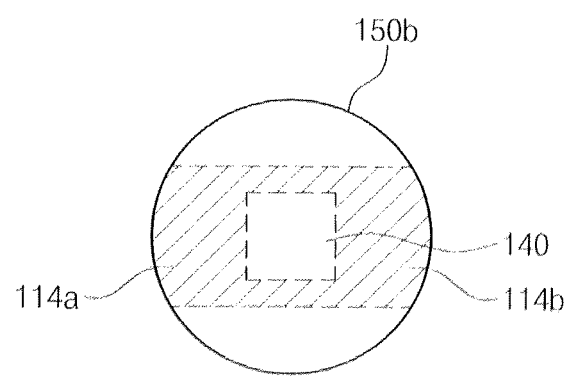
FIGS. 6B and 6c are top plan views illustrating an enlarged portion of FIG. 6A.
Figure 6C:
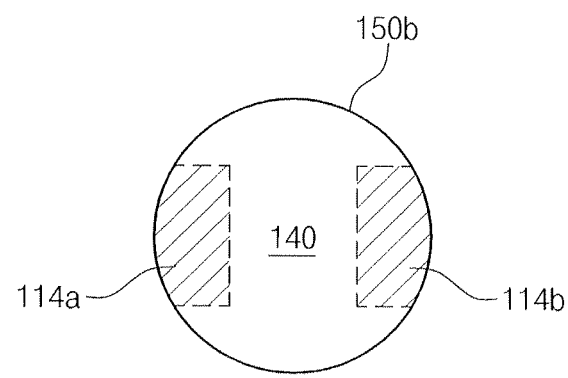

FIG. 6A is a top plan view depicting a portion of FIG. 1K and FIGS. 6B and 6C are top plan views enlarging a portion of FIG. 6A.

Referring to FIG. 6A, the redistributed lines 114a and 114b being electrically connected to the chip pad 104 is provided. The first bump pad 118a where the first solder bump 150a is connected is provided on the first redistributed line 114a and the second bump pad 118b where the second solder bump 150b is connected is provided between the first and second redistributed lines 114a and 114b. The region of the second redistributed line 114b exposed through the hole 141 in the insulating layer 130 may function as a bonding pad 142 where a bonding wire 160 is connected.

Referring to FIG. 6B, as described with reference to FIGS. 1E, 1F and 6A, the redistributed lines 114a and 114b may be formed to have a continuous connected structure surrounding the opening 140. As an example embodiment, as described with reference to FIG. 1F, the opening 140 formed by removing the photoresist pattern 112 may take the place of a portion of a width of the redistributed lines 114a and 114b. Thus, the redistributed lines 114a and 114b may remain electrically connected to one another, with electrical current or signals passing around the opening 140.

Referring to FIG. 6C, as another example embodiment, the opening 140 may sever the connection between the first and second redistributed lines 114a and 114b. Thus, the redistributed lines 114a and 114b may be divided into the first redistributed 114a and the second redistributed line 114b. This configuration allows for enhanced versatility of the semiconductor package 100, in that electrical connections between the first and second redistributed lines 114a and 114b, respectively, may be isolated.

FIGS. 2A through 2E are cross-sectional views illustrating a method of manufacturing a semiconductor package according to another embodiment of the present general inventive concept. Since the previous embodiment is similar to the present embodiment, the description of common features already discussed in the previous embodiment will be omitted for brevity, while any new or different features will be described in further detail below. Similar features to the previous embodiment include a substrate 201, a first insulating layer 202, a passivation layer 206, and a second insulation layer 208.

Figure 2A:
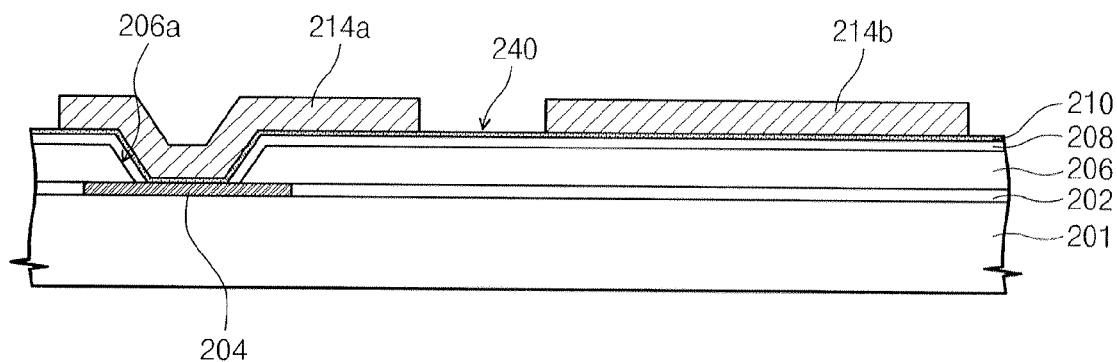
FIGS. 2A through 2E are cross-sectional views illustrating a method of manufacturing a semiconductor package according to a another embodiment of the present general inventive concept.

Referring to FIG. 2A, a first redistributed line 214a and a second redistributed line 214b including an opening 240 exposing a portion of a first metal layer 210 are formed. For example, the first metal layer 210 may be formed by sputtering copper (Cu), titanium (Ti)/copper (Cu), chromium (Cr)/copper (Cu), nickel (Ni), titanium (Ti)/nickel (Ni), chromium (Cr)/nickel (Ni) or the like.

Figure 2B:
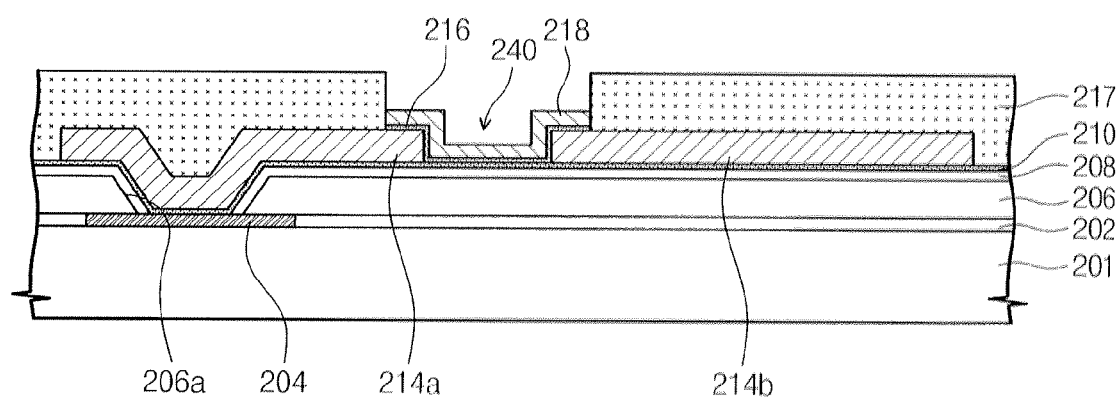

Referring to FIG. 2B, a photoresist pattern 217 is formed. The photoresist pattern 217 under which the opening 240 exists is opened. A bump pad 218 is formed in the opening 240 using the photoresist pattern 217 as a mask. The bump pad 218 may be formed by plating a solder or nickel using an electroplating. In this case, the first metal layer 210 may be used as a seed metal.

Before forming the bump pad 218, a second metal layer 216 may be further formed. For example, the second metal layer 216 may be formed by sputtering copper (Cu), titanium (Ti)/copper (Cu), chromium (Cr)/copper (Cu), nickel (Ni), titanium (Ti)/nickel (Ni), chromium (Cr)/nickel (Ni) or the like. The bump pad 218 may be formed by an electroplating process. The second metal layer 216 may be used as barrier layer preventing an ingredient (e.g., gold) included in the first and second redistributed lines 214a and 214b from being diffused into the bump pad 218 when annealing, other heat treatment, or other process is conducted that could cause diffusion. The first metal layer 210 also acts as a barrier layer against diffusion for gold or other metal layers diffusing in another direction. When the bump pad 218 is formed by electroplating, the second metal layer 216 may be used as a seed metal.

Figure 2C:
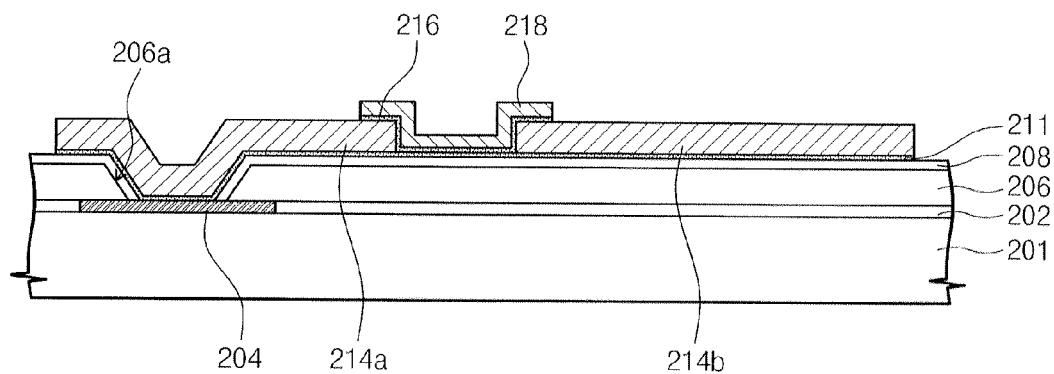

Referring to FIG. 2C, the photoresist pattern 217 is removed and the first metal layer 210 illustrated in FIG. 2B exposed by a removal of the photoresist pattern 217 is etched. In this case, the first and second redistributed lines 214a and 214b may be used as an etching mask to etch the first metal layer 210. The first metal layer 210 becomes a metal layer pattern 211 which is disposed under the first and second redistributed lines 214a and 214b by the removal of the portion of the first metal layer 210.

Figure 2D:
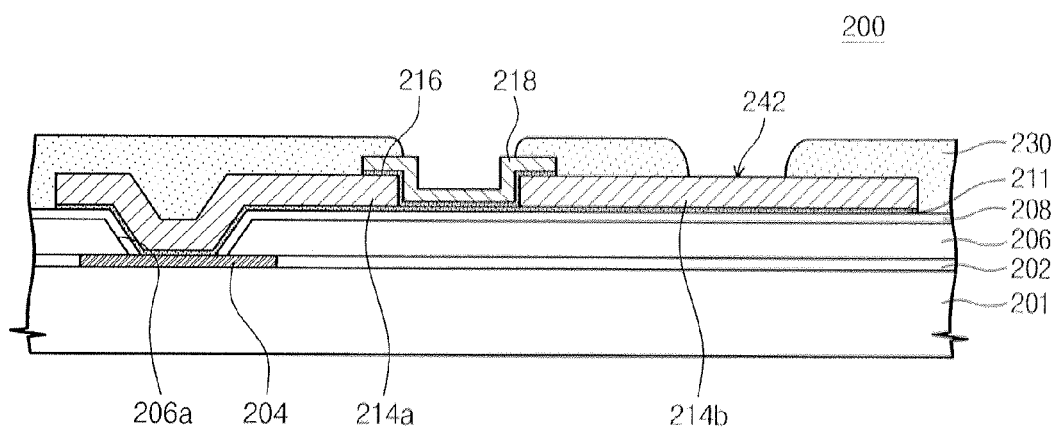

Referring to FIG. 2D, an insulating layer 230 is formed. The insulating layer 230 is formed to allow the bump pad 218 and a portion of the second redistributed line 214b exist to be exposed. A region where a portion of the redistributed line 214b is exposed may function as a bonding pad 242 to which a gold or other material wire may be bonded. Thus, a semiconductor package 200 of an embodiment of the present general inventive concept including a bump pad to which a solder bump may be connected and a wire bonding pad to which a gold wire may be bonded may be embodied through a series of the processes described above.

Figure 2E:
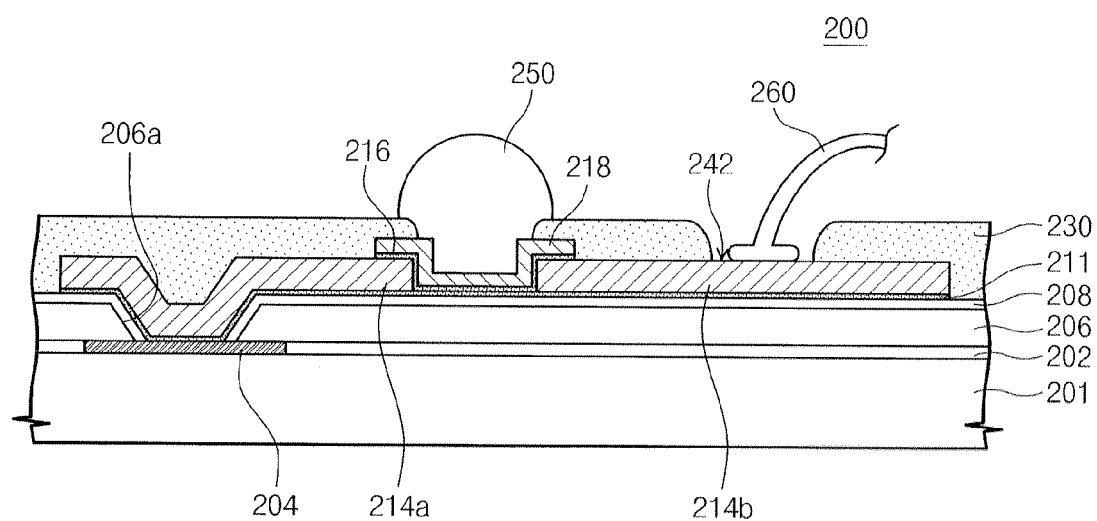

Referring to FIG. 2E, a solder bump 250 may be further formed on the bump pad 218 selectively, or by a number of known processes. In the semiconductor package 200, the second redistributed line 214b may function as a bonding pad 242 to which a bonding wire 260 is bonded as described above. Thus, the bonding wire 260 may be connected to the semiconductor package 200 together with the solder bump 250.

Figure 7:
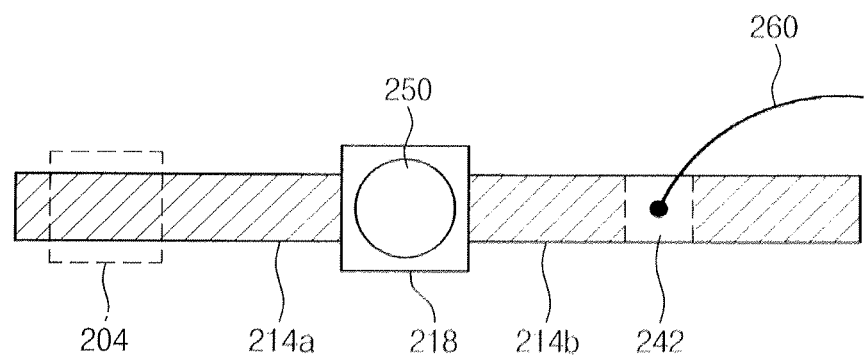
FIG. 7 is a top plan view illustrating a portion of FIG. 2E.

FIG. 7 is a top plan view depicting a portion of FIG. 2E.

Referring to FIG. 7, through a series of the processes described above, for example, the redistributed lines 214a and 214b that are electrically connected to the chip pad 204 are provided and the bump pad 218 to which a solder bump is connected is provided between the first redistributed line 214a and the second redistributed line 214b. A portion of the second redistributed line 214b may function as a bonding pad 242 to which the bonding wire 260 is connected.

The redistributed lines 214a and 214b, as illustrated in FIG. 6B, may be formed to have a continuous connected structure. Alternatively, the redistributed lines 214a and 214b, as illustrated in FIG. 6C, may be formed to have a separated structure divided into a first redistributed line 214a and a second redistributed line 214b by the opening 240.

Figure 3A:
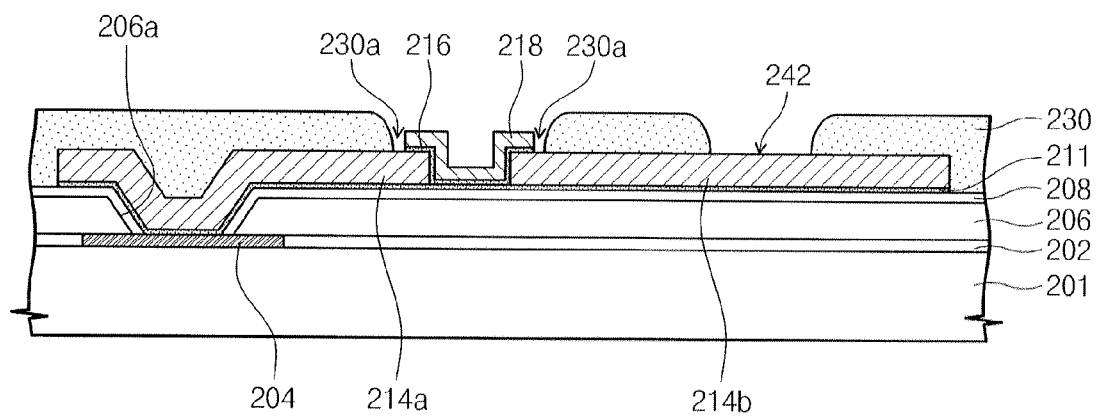
FIGS. 3A and 3B are cross-sectional views illustrating a method of manufacturing a semiconductor package according to a another embodiment of the present general inventive concept.

Referring to FIG. 3A according to yet another embodiment, an insulating layer 230 is formed. The insulating layer 230 is formed to allow a bump pad 218 and a portion of second redistributed line 214b to be exposed as described with reference to FIG. 2D, but in this case the insulating layer 230 is not in contact with the bump pad 218. In this case, spaces 230a may be formed on one or both sides of the bump pad 218 and the insulating layer 230.

Figure 3B:
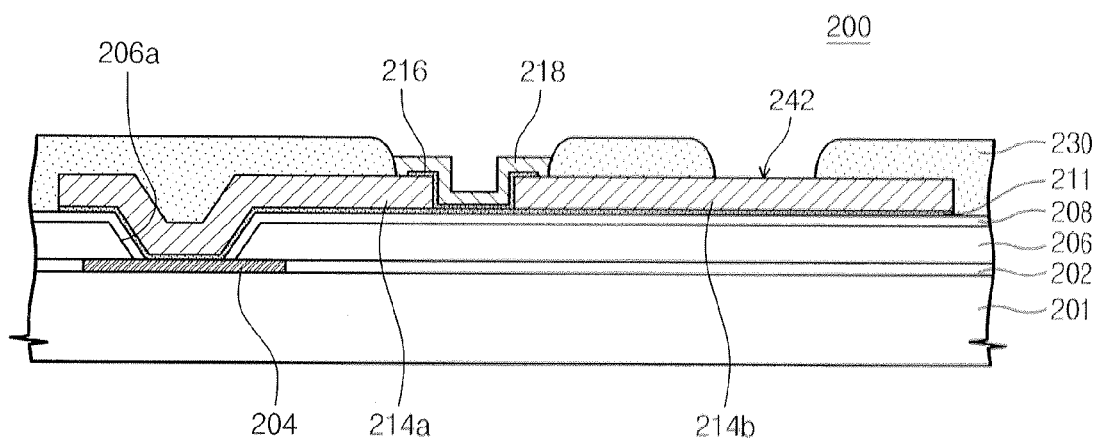

Referring to FIG. 3B, the bump pad may be reflowed so that the space 230a is filled with a plated solder or nickel. After reflow, the outer edges of the bump pad 218 make direct contact with the redistributed lines 214a and 214b. Therefore the insulating layer 230 is in contact with the redistributed lines 214a and 214b, but not in contact with the barrier layer 216. Thus, as described with reference to FIG. 2D, a semiconductor package having different pads 218 and 242 is embodied.

Figure 4B:
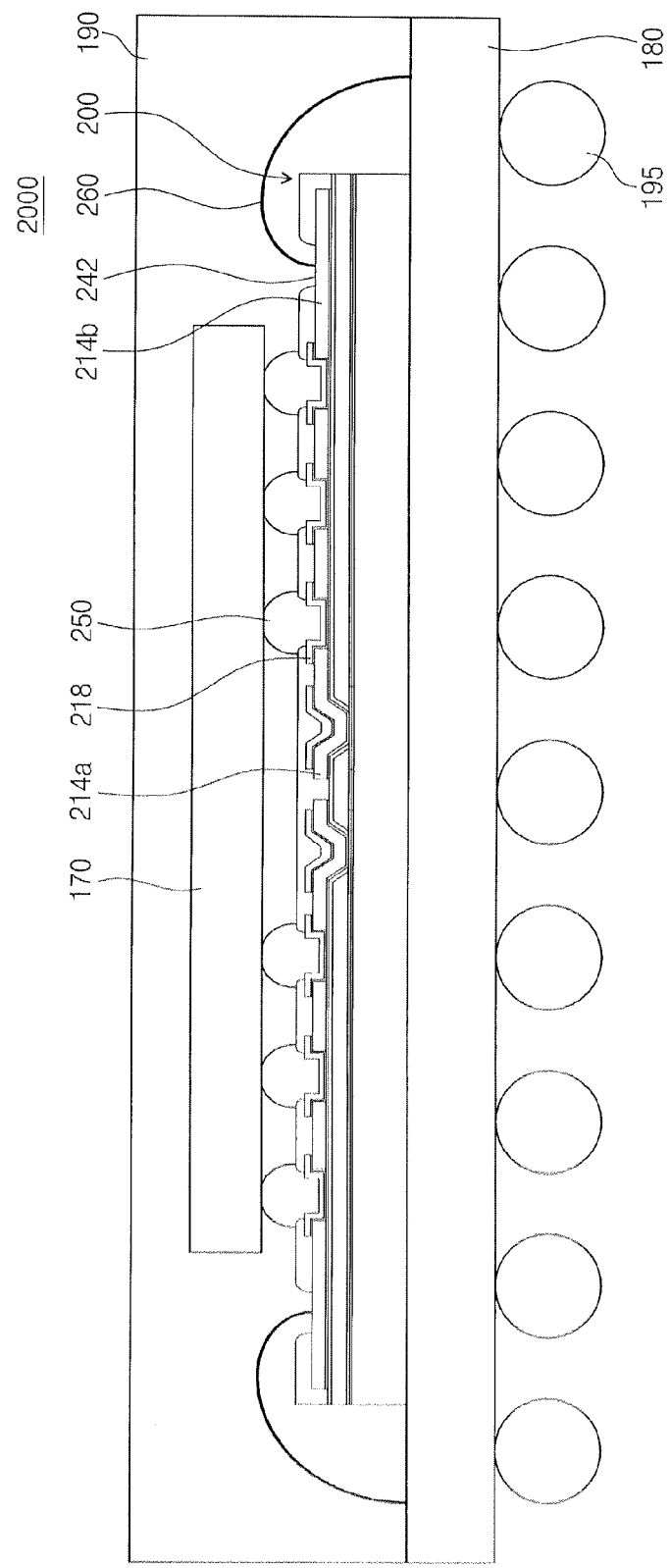

FIGS. 4A and 4B are cross-sectional views of a semiconductor package of a multi-chip structure according to example embodiments of the present general inventive concept.

Referring to FIG. 4A, in a multi-chip package 1000 such as a chip on chip, a semiconductor package 100 of the embodiment of FIG. 1K, for example, is mounted on a top surface of a printed circuit board 180 so that the semiconductor package 100 is electrically connected to the printed circuit board 180 by the medium of a bonding wire 160. A different kind of a semiconductor package 170 may be mounted on the semiconductor package 100 in a flip chip type so that the different kind of a semiconductor package 170 is electrically connected to the semiconductor package 100 by the medium of a plurality of solder bumps 150a and 150b. The semiconductor packages 100 and 170 may be a package of a chip unit. A molding layer 190 sealing up the semiconductor packages 100 and 170 may be formed on a top surface of the printed circuit board 180 and a plurality of solder balls 195 which are terminals for external connection are adhered to a bottom surface of the printed circuit board 180. The semiconductor packages 100 and 170 may include different chips. For instance, the semiconductor package 100 may include a memory chip and the semiconductor package 170 may include a logic chip, for example.

As described with reference to FIGS. 1A through 1K, the semiconductor package 100 may include different external terminals (e.g., bump pads 118a and 118b and a bonding pad 142 to which solder bumps 150a and 150b and a bonding wire 160 are adhered, respectively.

Referring to FIG. 4B, in a multi-chip package 2000 such as a chip on chip package, the semiconductor package 200 of the embodiment illustrated in FIG. 2E, for example, is electrically connected to a semiconductor die or chip 170 by the medium of a plurality of solder bumps 250 and is electrically connected to a printed circuit board by a bonding wire 260. FIG. 4B also illustrates a configuration where not all of the possible electrical connections are established between the semiconductor package 200 and the semiconductor package 170. For example, the recessed redistribution lines 214a are unconnected to solder bumps, but the bump pads 218 that are disposed above non-recessed portions of the redistributed lines are connected to solder bumps 250. By connecting the different solder bumps of the semiconductor package in different configurations, the versatility of the entire packaging structure is enhanced. Similarly, different size semiconductor dies and chips can be used in combination with the semiconductor package 200, to increase the functionality of the present general inventive concept.

Figure 5:
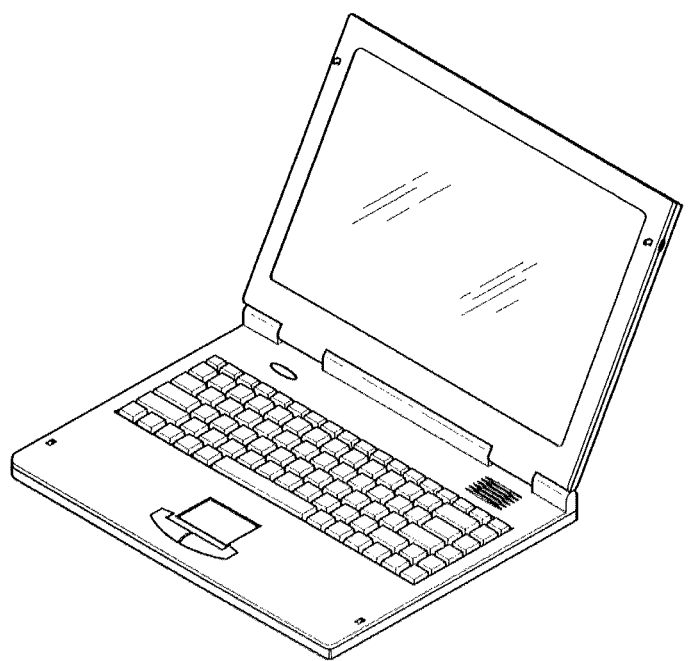
FIG. 5 is a perspective view illustrating an example of an electronic device including a semiconductor package according to some embodiments of the present general inventive concept.

FIG. 5 is a perspective view of an example of an electronic device including a semiconductor package according to some embodiments of the present general inventive concept.

Referring to FIG. 5, the semiconductor packages 100, 200, 1000 and 2000 described according to embodiments of the present general inventive concept may be used in an electronic device 3000 such as a note book computer. The electronic device 3000 may include a desk top computer, a camcorder, a mobile phone, a game player, a portable multimedia player (PMP), a MP3P player, a liquid crystal display, a plasma display (PDP), a memory card or the like. Particularly, since the electronic device may include a semiconductor device including different pads, a reliable electrical connection to a diverse amount different chips with varying functionalities can be embodied.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a semiconductor package, comprising:
   providing a substrate including a passivation layer exposing a chip pad;
   forming a first metal layer on the passivation layer, the first metal layer being electrically connected to the chip pad;
   forming a redistributed line including an opening on the first metal layer, the redistributed line at the opening being electrically connected to the chip pad and exposing a portion of the first metal layer;

forming an external terminal connection pad on the redistributed line;
connecting a first external terminal to the external terminal connection pad; and
forming an insulating layer exposing a portion of the redistributed line so as to use the portion of the redistributed line as an external terminal connection portion and connecting a different kind of a second external terminal to the portion of the redistributed line.

2. The method of manufacturing a semiconductor package of claim 1, wherein the opening divides the redistributed line into first and second redistributed lines of a connected configuration or a separated configuration.

3. The method of manufacturing a semiconductor package of claim 2, wherein forming the redistributed line comprises:
forming a first photoresist pattern on the first metal layer, the first photoresist pattern exposing a portion of the first metal layer;
forming the first and second redistributed lines by plating a conductive layer including gold using the exposed first metal layer as a seed metal and using the first photoresist pattern as a mask; and
forming the opening exposing the first metal layer by removing the first photoresist pattern.

4. The method of manufacturing a semiconductor package of claim 2, wherein forming the external terminal connection pad comprises:
forming a second metal layer on the redistributed line;
forming a first external terminal connection pad and a second external terminal connection pad on the second metal layer such that lowest bottom surfaces of the first and second external terminal connection pads are even with each other, wherein the first external terminal connection pad is formed on the first redistributed line and the second external terminal connection pad is formed on the opening; and
forming a first barrier layer disposed between the first external terminal connection pad and the first redistributed line, and a second barrier layer disposed between second external terminal connection pad and the first and second redistributed lines by selectively removing the second metal layer.

5. The method of manufacturing a semiconductor package of claim 2, wherein forming the external terminal connection pad comprises:
forming a second photoresist pattern on the redistributed line, the second photoresist pattern exposing the opening; and
forming the external terminal connection pad by plating a conductive layer using the first metal layer exposed by the opening as a seed metal and using the second photoresist pattern as a mask.

6. The method of manufacturing a semiconductor package of claim 5, further comprising:
forming a second metal layer in the opening before forming the external terminal connection pad; and
forming the external terminal connection pad by plating a conductive layer using the second metal layer as a seed metal and using the second photoresist pattern as a mask.

7. The method of manufacturing a semiconductor package of claim 5, wherein forming the external terminal connection pad comprises:
forming the insulating layer so that a space is formed between the sides of the conductive layer and the insulating layer; and
forming the external terminal connection pad so that the space is filled by reflowing the conductive layer.

8. A method of manufacturing a semiconductor package, comprising:
forming a first metal layer on a passivation layer that exposes a chip pad, the first metal layer being electrically connected to the chip pad; and
forming a redistributed line including an opening on the first metal layer, the opening dividing a first redistributed line from a second redistributed line such that thicknesses of the first redistributed line and the second redistributed line are equal to a thickness of the passivation layer.

9. The method of manufacturing a semiconductor package of claim 8, further comprising:
forming a first external terminal connection pad on the first redistributed line, the first external terminal connection pad having a first connection surface to which a first external terminal being electrically connected; and
forming a second external terminal connection pad on the opening, the second external terminal connection pad having a second connection surface to which a second external terminal is electrically connected.

10. The method of manufacturing a semiconductor package of claim 9, wherein a height of the first connection surface is substantially equal to a height of the second connection surface.

11. The method of manufacturing a semiconductor package of claim 9, further comprising:
forming a second metal layer on the first and second redistributed lines; and
patterning the second metal layer to form a barrier layer between the first and second external terminal connection pads and the first and second redistributed lines.

12. The method of manufacturing a semiconductor package of claim 11, wherein forming the barrier layer comprises:
forming a first barrier layer between the first external terminal connection pad and the first redistributed line; and
forming a second barrier layer between the second external terminal connection pad and the first and second redistributed lines.

13. The method of manufacturing a semiconductor package of claim 9, further comprising:
forming an insulating layer exposing the first and second external terminal connection pads on the first and second redistributed lines,
wherein the insulating layer exposes a portion of the second redistributed line so as to define the portion of the second redistributed line as an external terminal connection portion.

14. The method of manufacturing a semiconductor package of claim 13, further comprising:
forming first and second bumps electrically connected to the first and second external terminal connection pads, respectively; and
forming a bonding wire electrically connected to the external terminal connection portion,
wherein a height of the first bump is substantially equal to a height of the second bump.

15. The method of manufacturing a semiconductor package of claim 8, further comprising:
forming a lower insulating layer that exposes the chip pad between the passivation layer and the first metal layer.

16. A method of manufacturing a semiconductor package, comprising:
providing a substrate having a chip pad;
forming a passivation layer on the substrate, the passivation layer having a first opening through which the chip pad is exposed;

forming a first metal layer electrically connected to the chip pad on the passivation layer;

forming a redistributed line electrically connected to the chip pad on the first metal layer, the redistributed line having a second opening through which a portion of the first metal layer is exposed;

forming an external terminal connection pad on the redistributed line;

forming a barrier layer between the redistributed line and the external terminal connection pad; and forming an insulating layer on the redistributed line, the insulating layer having a third opening that exposes a portion of the redistributed line such that the exposed portion of the redistributed line is used as an external terminal connection portion.

17. The method of manufacturing a semiconductor package of claim 16, wherein forming the redistributed line comprises:

forming a first redistributed line which is recessed toward the first opening so as to be electrically connected to the chip pad; and forming a second redistributed line divided from the first redistributed line by the second opening, wherein thicknesses of the first and second redistributed lines are substantially equal to a thickness of the passivation layer.

18. The method of manufacturing a semiconductor package of claim 17, wherein forming the external terminal connection pad comprises:

forming a first external terminal connection pad on the first redistributed line, the first external terminal connection pad having a first connection surface recessed toward the first opening; and forming a second external terminal connection pad on the second opening, the second external terminal connection pad having a second connection surface at substantially same level with the first connection surface.

19. The method of manufacturing a semiconductor package of claim 18, wherein forming the barrier layer comprises:

forming a first barrier layer covering a bottom surface of the first external terminal connection pad; and forming a second barrier layer covering a bottom surface of the second external terminal connection pad.

20. The method of manufacturing a semiconductor package of claim 18, further comprising:

forming a first bump electrically connected to the first connection surface of the first external terminal connection pad;

forming a second bump electrically connected to the second connection surface of the second external terminal connection pad, the second bump having a height substantially equal to a height of the first bump; and forming a bonding wire elongated through the third opening to be electrically connected to the external terminal connection portion.

* * * * *